US011379018B2

United States Patent
Na et al.

(10) Patent No.: US 11,379,018 B2
(45) Date of Patent: Jul. 5, 2022

(54) DISPLAY APPARATUS INCLUDING A MODULE COVER

(71) Applicant: LG ELECTRONICS INC., Seoul (KR)

(72) Inventors: Seokhun Na, Seoul (KR); Jaehun Lee, Seoul (KR); Jaewoo Cho, Seoul (KR); Kwangho Choi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/051,424

(22) PCT Filed: Nov. 30, 2018

(86) PCT No.: PCT/KR2018/015065
§ 371 (c)(1),
(2) Date: Oct. 28, 2020

(87) PCT Pub. No.: WO2020/022581
PCT Pub. Date: Jan. 30, 2020

(65) Prior Publication Data
US 2021/0223833 A1    Jul. 22, 2021

(30) Foreign Application Priority Data
Jul. 27, 2018    (KR) .................. 10-2018-0088175

(51) Int. Cl.
*G06F 1/18*    (2006.01)
(52) U.S. Cl.
CPC ............. *G06F 1/185* (2013.01); *G06F 1/186* (2013.01)
(58) Field of Classification Search
CPC ......... G02F 1/133308; G02F 1/133314; G02F 1/13452; G06F 1/1601; G06F 1/185; G06F 1/186; H05K 5/0026
See application file for complete search history.

(56) References Cited

U.S. PATENT DOCUMENTS 7,924,363 B2 *    4/2011    Park .................. G02F 1/133308
                                                              349/58
2003/0227581 A1    12/2003    Sung et al.
(Continued)

FOREIGN PATENT DOCUMENTS

KR    20010098113    11/2001
KR    20030095132    12/2003
(Continued)

OTHER PUBLICATIONS

PCT International Application No. PCT/KR2018/015065, International Search Report dated Apr. 16, 2019, 3 pages.
(Continued)

*Primary Examiner* — James Wu
(74) *Attorney, Agent, or Firm* — Lee, Hong, Degerman, Kang & Waimey PC

(57) ABSTRACT

A display device according to an embodiment of the present disclosure may include a display panel; a module cover disposed on the rear side of the display panel; a PCB mounted on the rear surface of the module cover; a side bracket connected to a side of the PCB and restricted by the rear surface of the module cover; and a restriction member restricting the PCB and the side bracket to the module cover and grounding the PCB to the module cover. The restriction member may include a head portion which is in contact with the PCB and restricts the side bracket; and a fastening portion extending from the head portion and fastened to the module cover.

11 Claims, 14 Drawing Sheets

(56) References Cited

U.S. PATENT DOCUMENTS

2004/0041960 A1     3/2004    Hwang
2008/0246901 A1    10/2008    Park

FOREIGN PATENT DOCUMENTS

| KR | 20040099604 | 12/2004 |
|---|---|---|
| KR | 100879302 | 1/2009 |
| KR | 20110076304 | 7/2011 |

OTHER PUBLICATIONS

European Patent Office Application Serial No. 18927456.6, Search Report dated Feb. 9, 2022, 10 pages.

\* cited by examiner

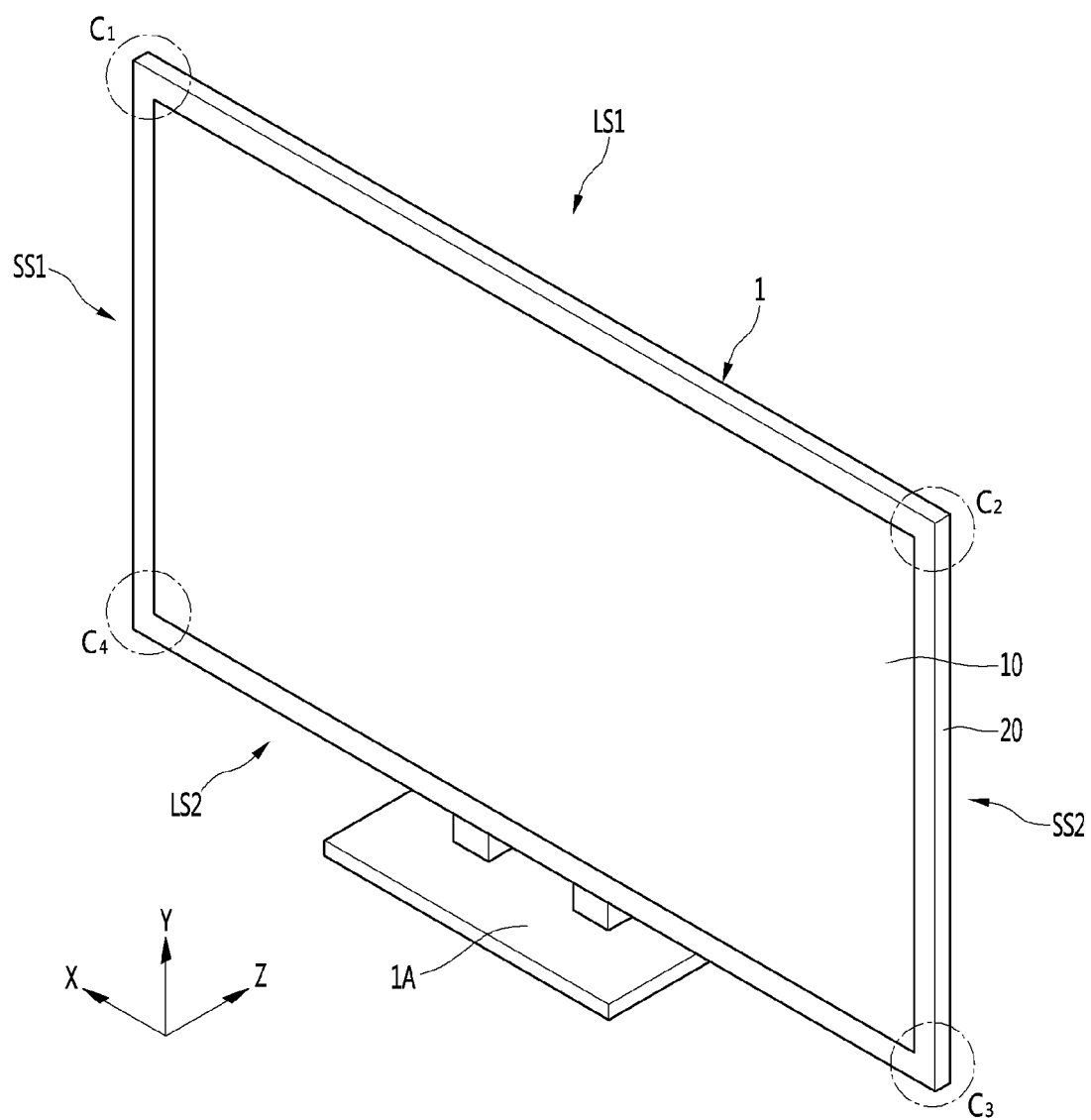
[Fig.1]

[Fig.2]
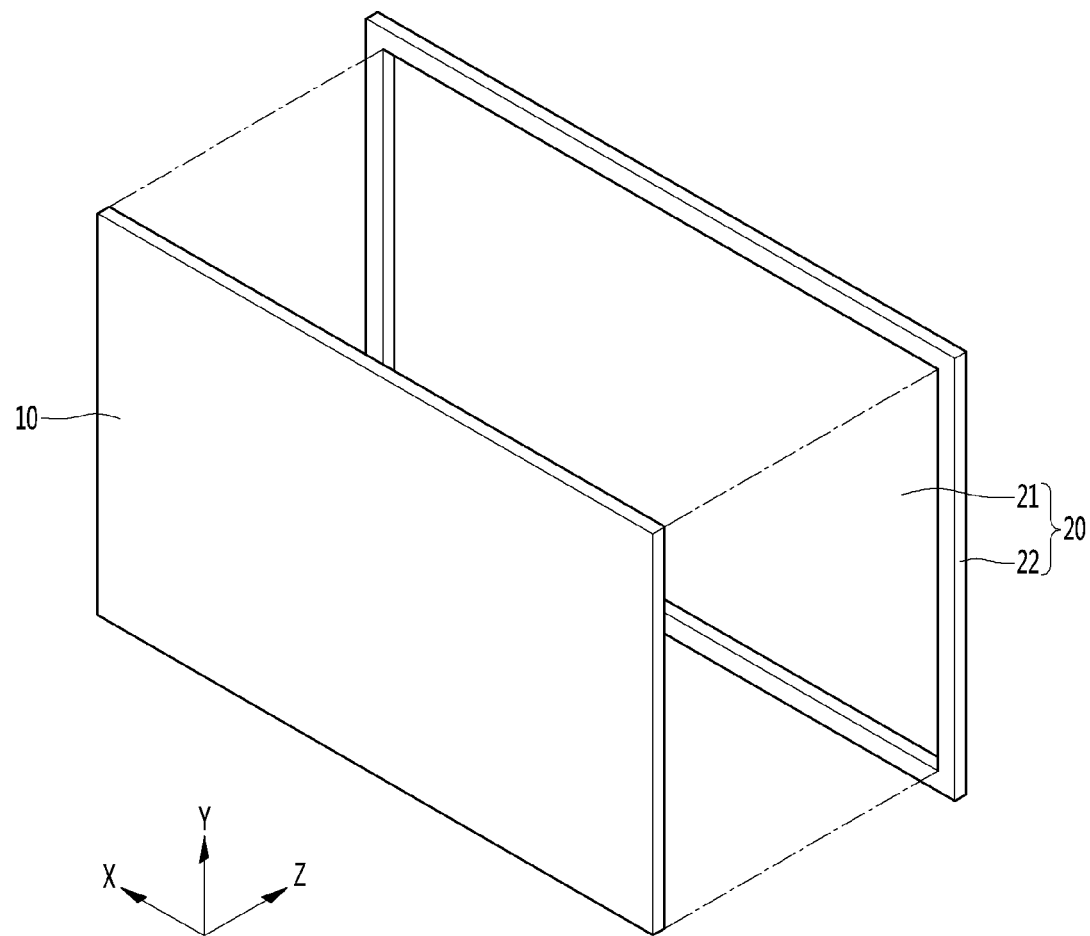

【Fig.3】
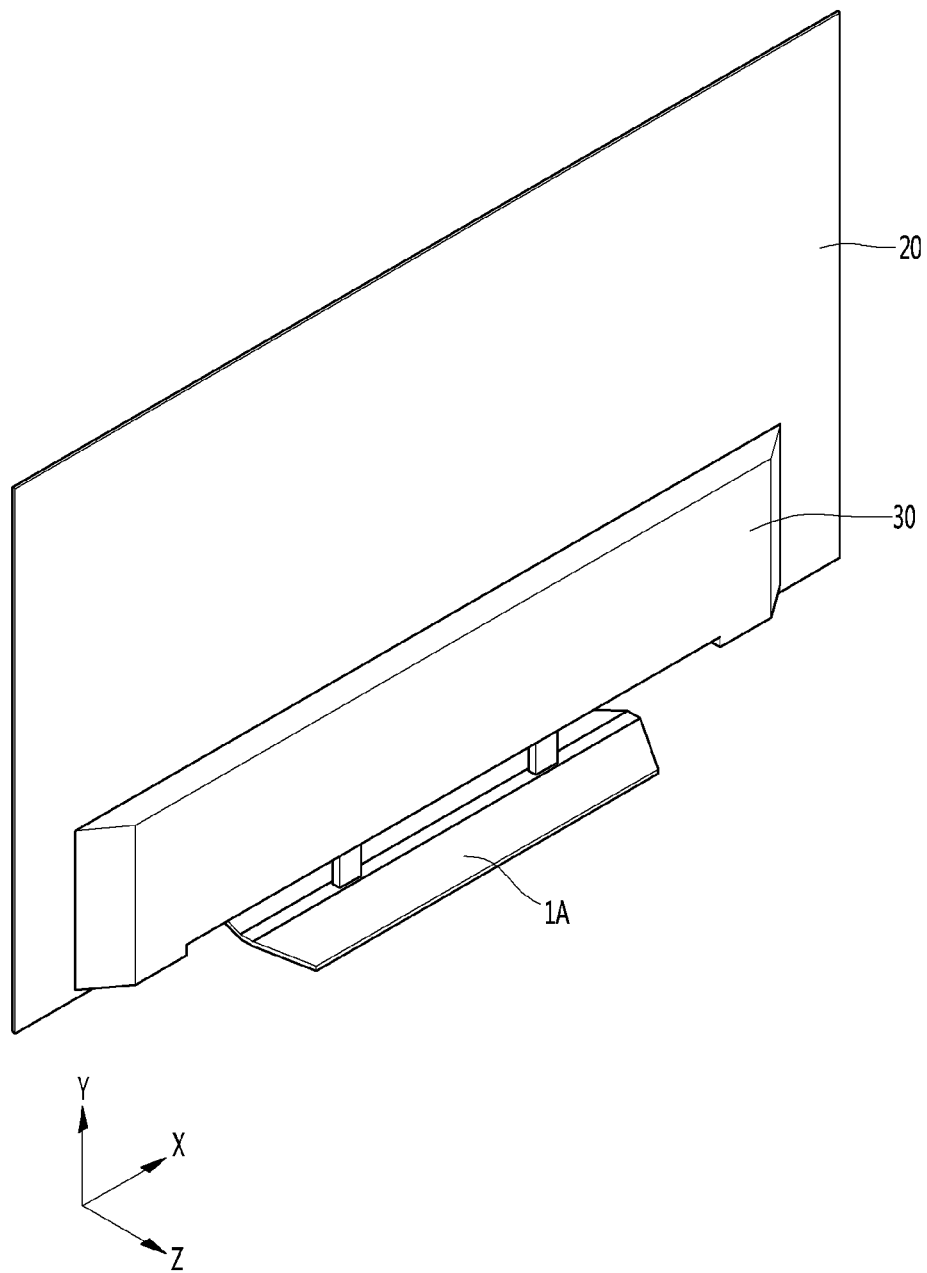

[Fig.4]
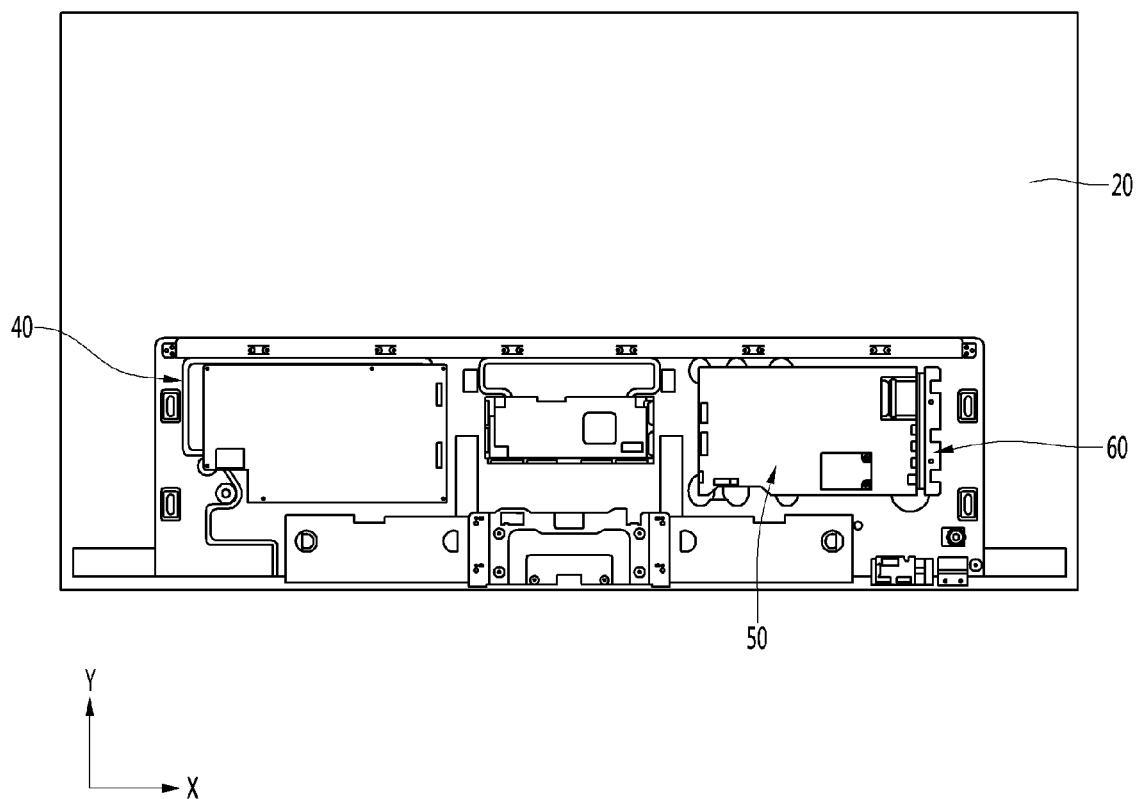

[Fig.5]
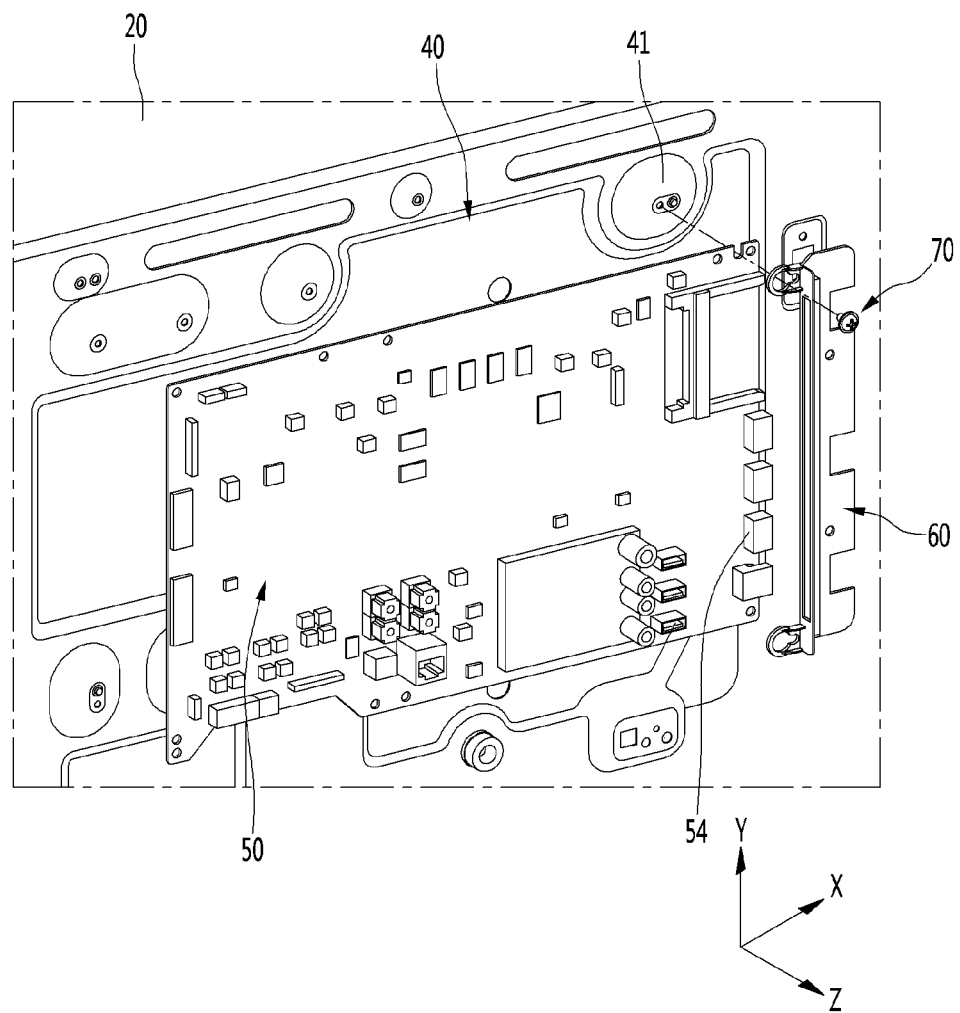

[Fig.6]
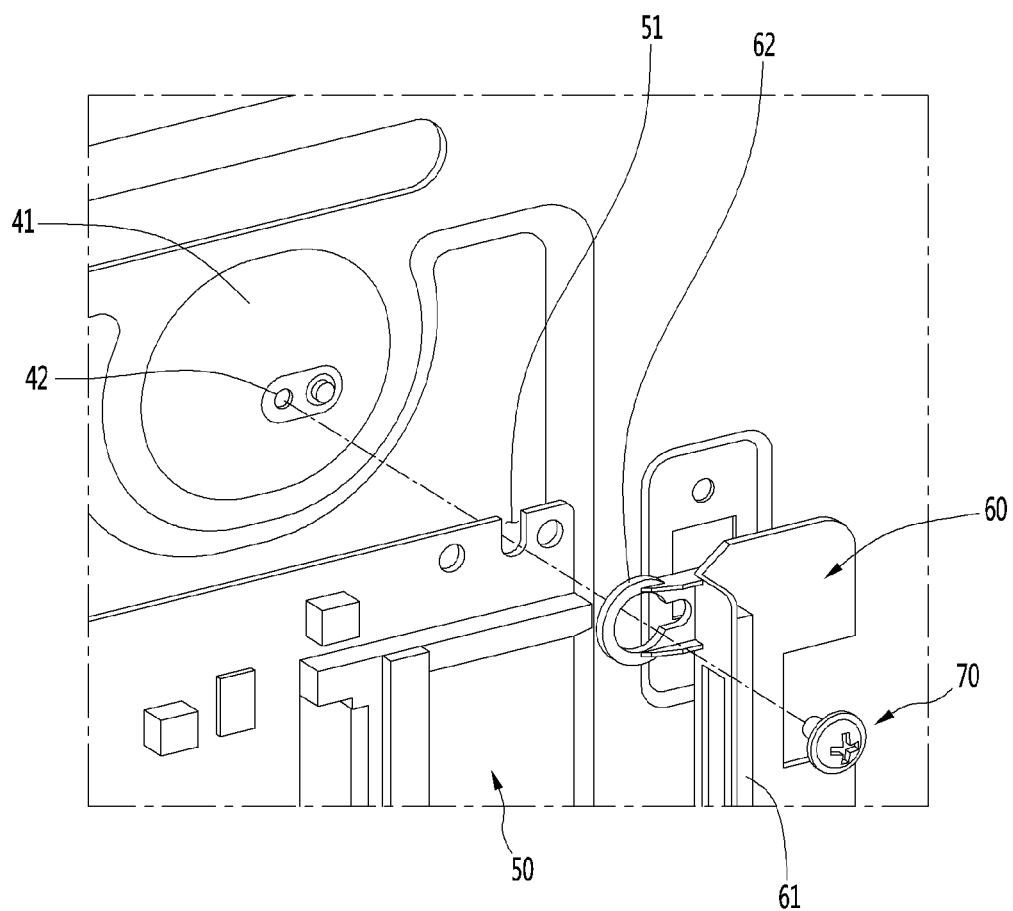

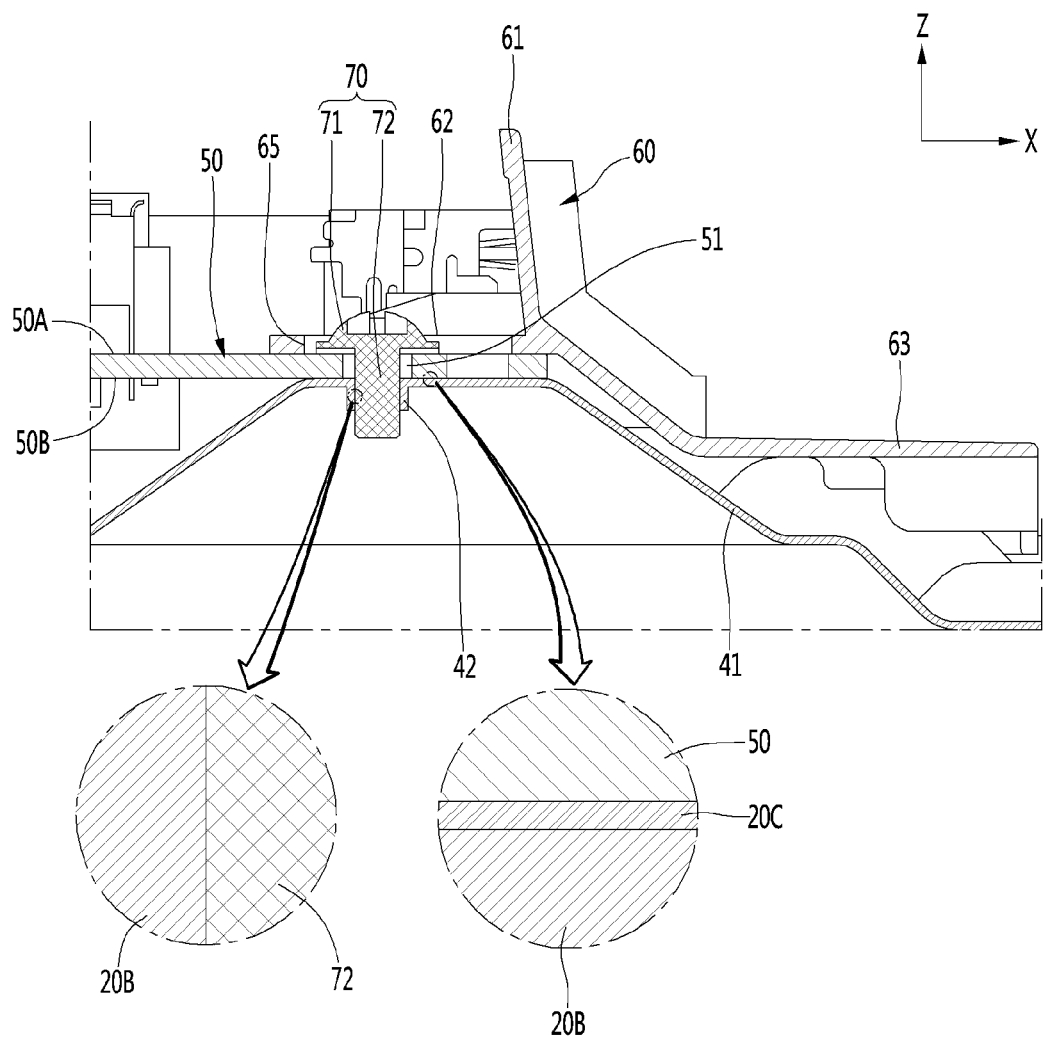
[Fig.7]

[Fig.8]
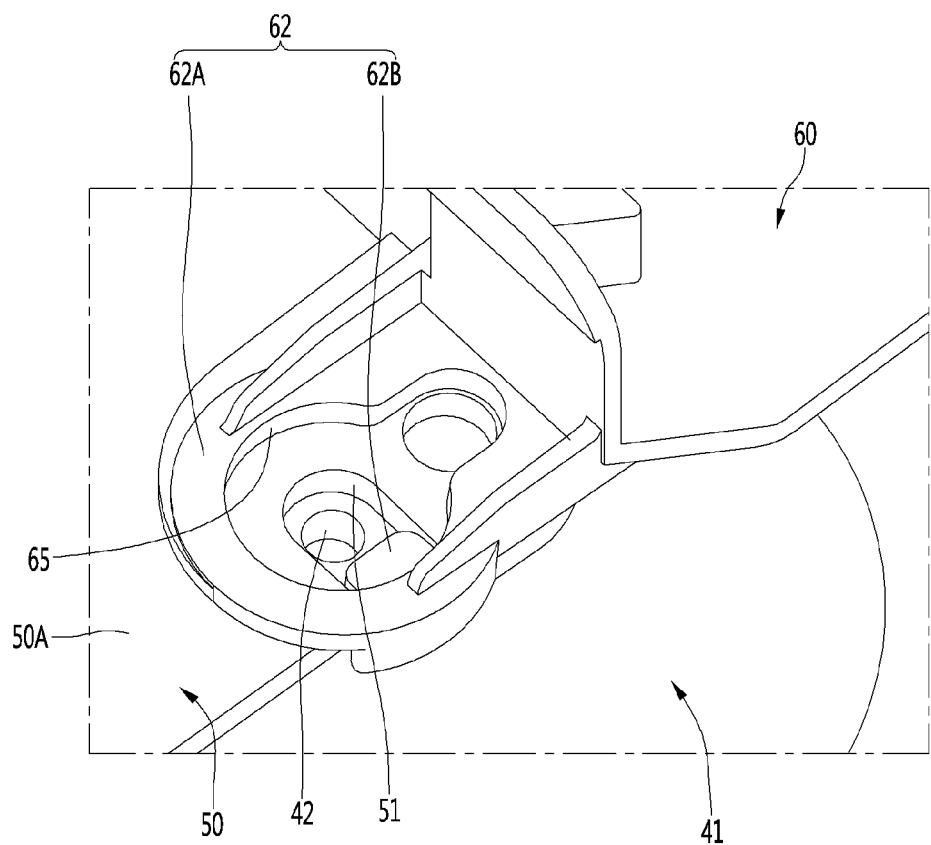

[Fig.9]
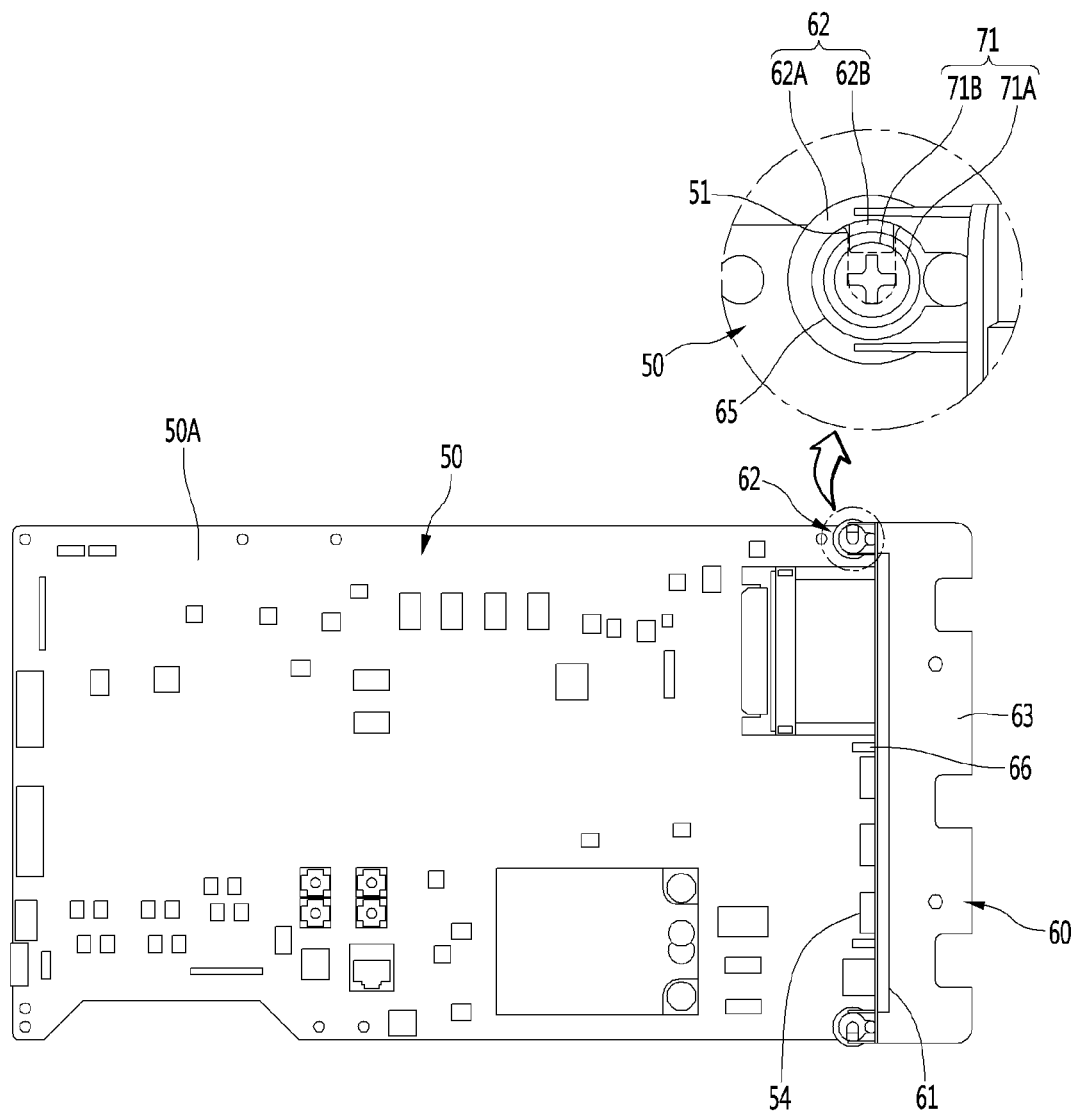

[Fig.10]
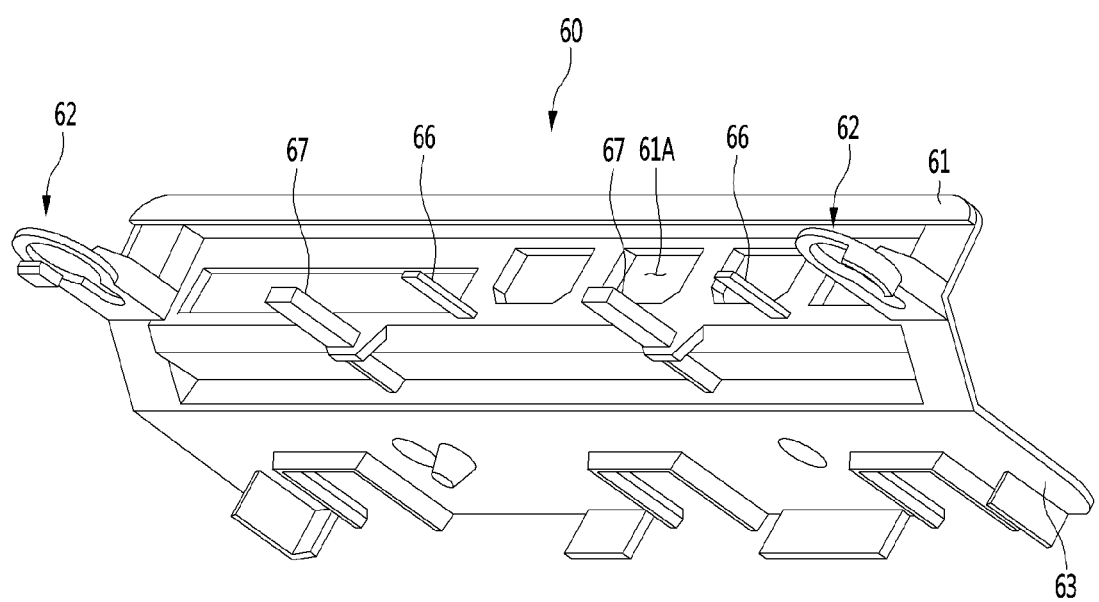

[Fig.11]
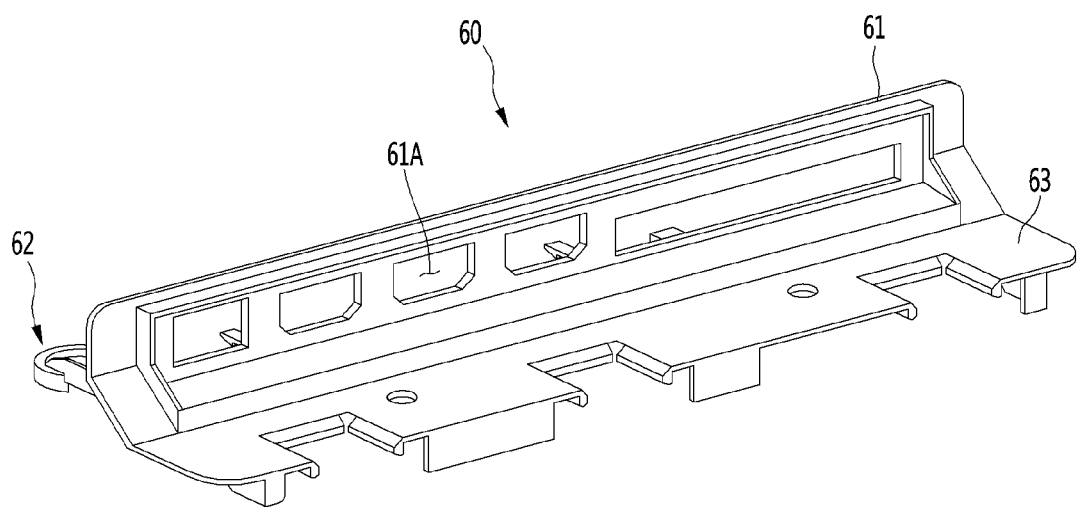

[Fig.12]
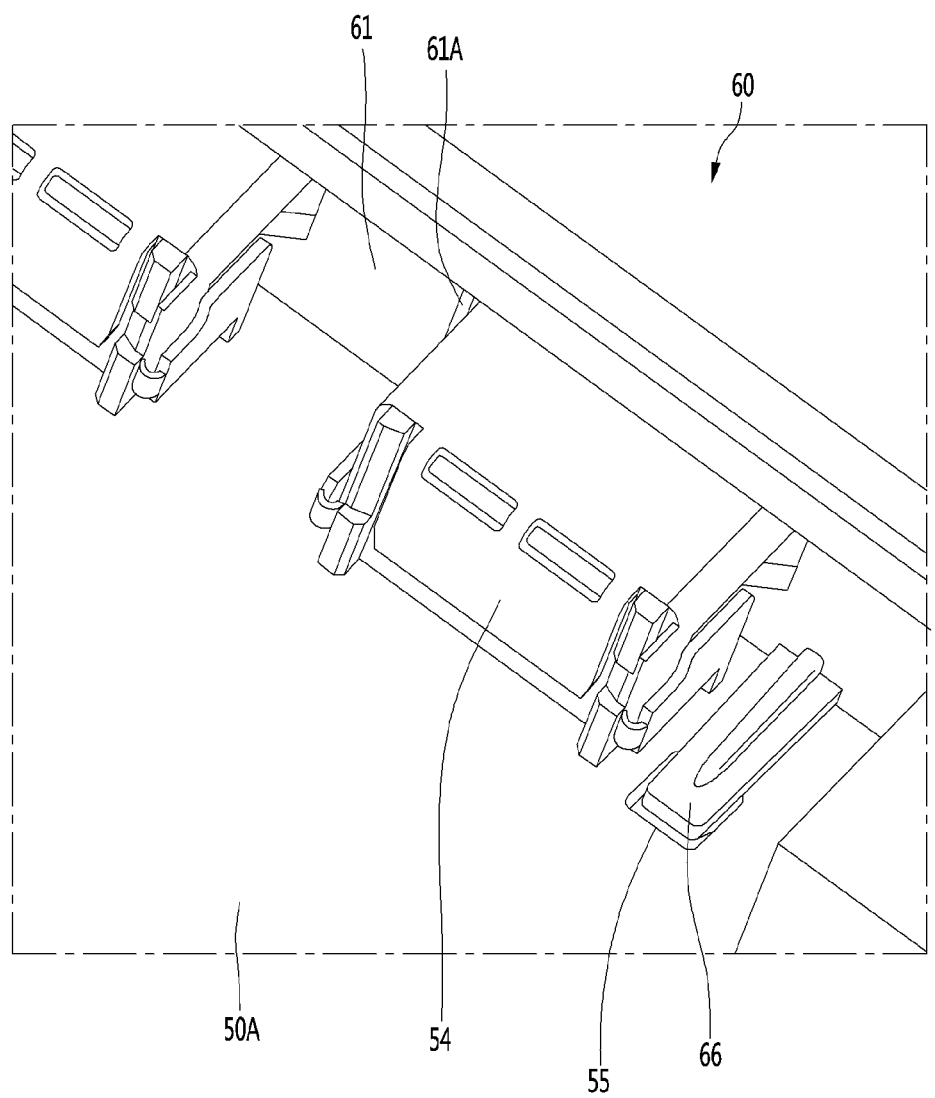

[Fig.13]
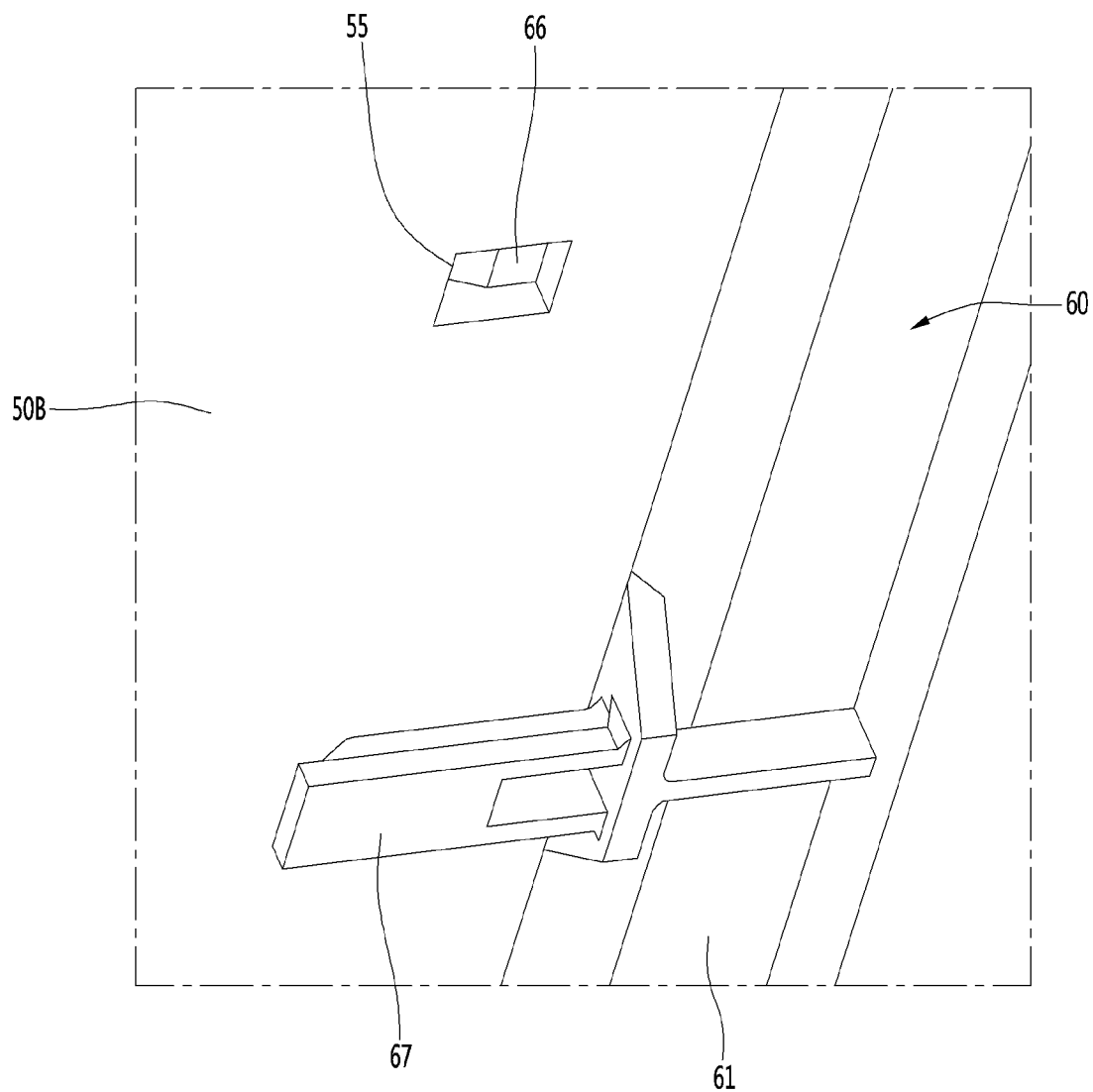

[Fig.14]
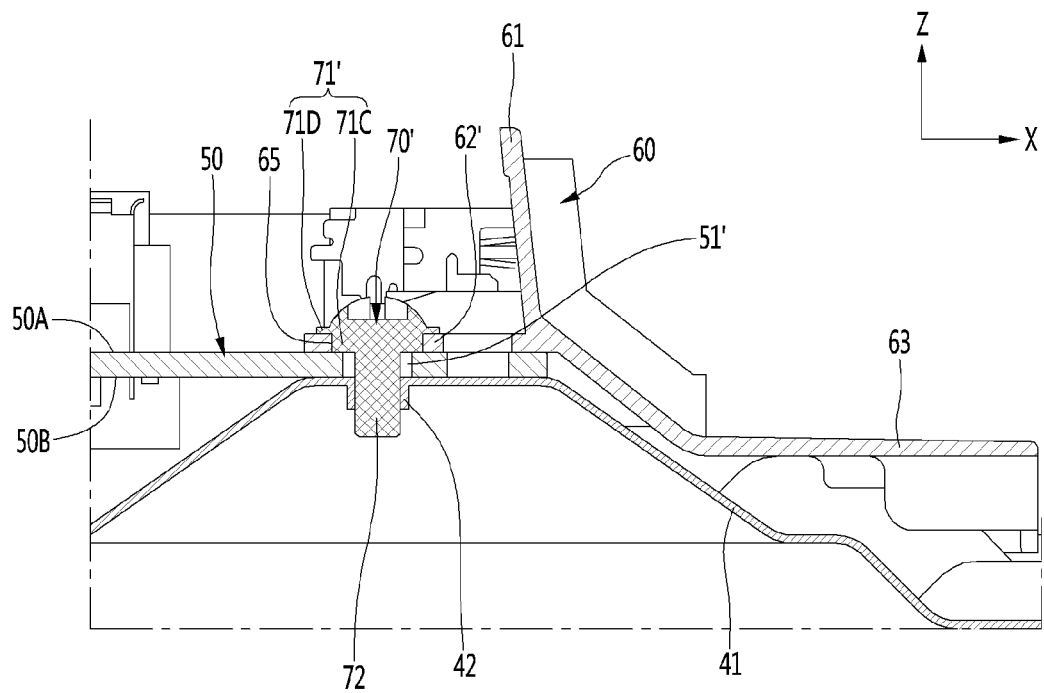

DISPLAY APPARATUS INCLUDING A MODULE COVER

CROSS-REFERENCE TO RELATED APPLICATIONS

This application is the National Stage filing under 35 U.S.C. 371 of International Application No. PCT/KR2018/015065, filed on Nov. 30, 2018, which claims the benefit of earlier filing date and right of priority to Korean Application No. 10-2018-0088175, filed on Jul. 27, 2018, the contents of which are all hereby incorporated by reference herein in their entirety.

TECHNICAL FIELD

The present disclosure relates to a display device, and more particularly, to a display device including a PCB and a side bracket.

BACKGROUND ART

A display device includes a liquid crystal display (LCD), a field emission display (FED), a plasma display panel (PDP), an electroluminescence device, or the like.

As an example of the electroluminescence device, an organic light-emitting display device of an active matrix type using an organic light-emitting diode (OLED) is commercially available. Since the organic light-emitting display device is a self-luminous device, the organic light-emitting display device has no backlight compared to the liquid crystal display, and has advantages in response speed, a viewing angle, or the like and thus is attracting attention as a next-generation display device.

The display device includes a display panel on which an image is displayed, and a module cover covering an outer circumference and a rear surface of the display panel.

In a conventional display device, since the module cover is metal, a PCB such as a main board can be in contact with the module cover and function as a ground for the PCB. In other words, as the PCB is directly in contact with the module cover and is grounded, electromagnetic interference (EMI) could be reduced.

However, in recent years, there is a trend of changing the design of the module cover to form a portion of an outer appearance of the display device, and accordingly, a coating layer is formed on the surface of the module cover. Therefore, even if the PCB is in contact with the module cover, there was a problem that the grounding performance of the module cover was deteriorated due to the coating layer, and to solve this problem, a method of using a separate conductive tape (EMI Tape) was devised, but there is a problem additional cost occurs, the manufacturing process thereof becomes complicated, and it is difficult to ensure uniform quality so that the reliability of the grounding deteriorates.

DISCLOSURE

Technical Problem

One problem to be solved by the present disclosure is to provide a display device with improved EMI due to a PCB while using a module cover including a coating layer having high insulation resistance on the surface thereof.

Another problem to be solved by the present disclosure is to provide a display device in which a PCB is grounded to a module cover by a restriction member that restricts the PCB and the side bracket.

Technical Solution

A display device according to the present disclosure may include a display panel, a module cover disposed behind the display panel, a PCB mounted on a rear surface of the module cover, a side bracket connected to a side of the PCB and restricted by the rear surface of the module cover, and a restriction member restricting the PCB and the side bracket to the module cover and grounding the PCB to the module cover. The restriction member may include a head portion which is in contact with the PCB and restricts the side bracket, and a fastening portion extending from the head portion and fastened to the module cover.

The module cover may include a cover main body which is made of metal and in contact with the fastening portion, and a coating layer which is coated on a surface of the cover main body, has an insulation resistance higher than that of the cover main body, and is in contact with the PCB.

The side bracket may include a bracket body having a terminal hole corresponding to a terminal provided in the PCB, and a PCB connector protruding from the bracket body and restricted by the head portion.

A fixing recess in which a portion of the fastening portion is located may be formed in the PCB.

The PCB connector may include a contact portion which has an open hole larger than the head portion and is in contact with the PCB, and a fixing piece which is connected to the contact portion and inserted into the fixing recess.

The head portion may include a first region which is in contact with the PCB; and a second region which is in contact with the fixing piece.

An area of the first region may be wider than an area of the second region.

At least a portion of an outer circumference of the head portion may be surrounded by an inner circumference of the opening hole.

The side bracket may further include at least one of a latch protruding from the bracket body and connected to the PCB and a rib protruding from the bracket body and supporting the PCB.

The side bracket may include a latch protruding from the bracket body and connected to one of a front surface and a rear surface of the PCB, and a rib protruding from the bracket body and supporting the other of the front surface and the rear surface of the PCB.

The module cover may be made of PCM material.

The head portion may include a small-diameter portion which is in contact with the PCB; and a large-diameter portion having a larger diameter than the small-diameter portion and restricting the side bracket.

Advantageous Effect

According to a preferred embodiment of the present disclosure, since the PCB can be grounded to the module cover by the restriction member, EMI caused due to the PCB can be improved.

In addition, since the cover module forming the outer appearance of the display device includes a coating layer having high insulation resistance, the safety of the display device can be improved, and the outer appearance of the display device can be improved in design.

In addition, compared to a case where the PCB is grounded with the module cover using a separate subsidiary material such as a conductive tape, the cost is reduced, the manufacturing process is simplified, and the reliability of grounding is improved by securing uniform quality.

In addition, the side bracket can be temporarily fixed to the PCB by the latch and rib of the side bracket. Accordingly, since the restriction member can be fastened to the module cover while the side bracket and the PCB are temporarily fixed, ease of assembly can be improved.

In addition, since the fixing piece is fitted and fixed in the fixing recess of the PCB, and the fixing piece is restricted by the restriction member, the connection between the PCB and the side bracket can be solid.

DESCRIPTION OF DRAWINGS

FIG. 1 is a perspective view illustrating a display device according to an embodiment of the present disclosure.

FIG. 2 is a view illustrating a display panel and a module cover.

FIG. 3 is a rear perspective view illustrating a display device according to an embodiment of the present disclosure.

FIG. 4 is a rear view illustrating a state where a back cover illustrated in FIG. 3 is removed.

FIG. 5 is a view illustrating a state where a PCB and a side bracket are separated from a module cover according to an embodiment of the present disclosure.

FIG. 6 is a view for explaining a state where the PCB and the side bracket illustrated in FIG. 5 are restricted to the module cover by a restriction member.

FIG. 7 is a sectional view illustrating a state where a PCB and a side bracket are restricted to a module cover by a restriction member according to an embodiment of the present disclosure.

FIG. 8 is an enlarged view illustrating a fixing recess of a PCB and a PCB connector of a side bracket.

FIG. 9 is a rear view illustrating a PCB and a side bracket according to an embodiment of the present disclosure.

FIG. 10 is a perspective view illustrating a side bracket according to an embodiment of the present disclosure.

FIG. 11 is a perspective view illustrating the side bracket illustrated in FIG. 10 viewed in a different direction.

FIG. 12 is an enlarged view illustrating a periphery of a latch of the side bracket.

FIG. 13 is an enlarged view illustrating a periphery of a rib of the side bracket.

FIG. 14 is a sectional view illustrating a state where a PCB and a side bracket are restricted to a module cover by a restriction member according to another embodiment of the present disclosure.

BEST MODE

Hereinafter, specific embodiments of the present disclosure will be described in detail together with the drawings.

FIG. 1 is a perspective view illustrating a display device according to an embodiment of the present disclosure, FIG. 2 is a view illustrating a display panel and a module cover, FIG. 3 is a rear perspective view illustrating a display device according to an embodiment of the present disclosure, and FIG. 4 is a rear view illustrating a state where a back cover illustrated in FIG. 3 is removed.

A display device according to an embodiment of the present disclosure may include a display module 1, a stand 1A supporting the display module 1 from below, and a back cover 30 located at the rear of the display module 1.

The display module 1 may have a substantially rectangular plate shape. In more detail, the display module 1 may include a first long side LS1, a second long side LS2 facing the first long side LS1, a first short side SS1 adjacent to one ends of the first long side LS1 and the second long side LS2, and a second short side SS2 facing the first short side SS1.

The first long side LS1, the second long side LS2, the first short side SS1, and the second short side SS2 may mean an upper side, a lower side, a left side, and a right side of the display module 1, respectively.

The lengths of the first and second long sides LS1 and LS2 may be formed longer than the lengths of the first and second short sides SS1 and SS2 but are not limited thereto, and the lengths of the first and second long sides LS1 and LS2 also possible to be approximately the same as the lengths of the first and second short sides SS1 and SS2.

In addition, a point where the first long side LS1, the second long side LS2, the first short side SS1, and the second short side SS2 meet each other may be referred to as a corner. For example, the point where the first long side LS1 and the first short side SS1 meet can be referred to as a first corner C1, the point where the first long side LS1 and the second short side SS2 can be referred to as a second corner C2, the point where the second short side SS2 and the second long side LS2 meet can be referred to as a third corner C3, and the point where the second long side LS2 and the first short side SS1 meet can be referred to as a fourth corner C4.

The display module 1 may be supported by the stand 1A. The stand 1A may support the display module 1 at the bottom of the display module 1.

The display module 1 may include a display panel 10 that displays an image, and a module cover 20 that covers the display panel 10 from the rear.

The display panel 10 may be an OLED panel. The display panel 10 may display an image forward.

The module cover 20 may be configured as a square frame. The module cover 20 may include a cover main body 20B (see FIG. 7) made of a metal material, and a coating layer 20C (see FIG. 7) coated on the surface of the cover main body 20B. The insulation resistance of the coating layer 20C may be greater than the insulation resistance of the cover main body 20B.

For example, the module cover 20 may be made of a Pre-Coated Metal (PCM) material.

The module cover 20 may include a cover body 21 located at the rear of the display panel 10 and a cover circumference part 22 protruding forward from the circumference of the cover body 21 and surrounding the outer circumference of the display panel 10. The module cover 20 may further include a heat dissipation plate (not illustrated) attached to the rear surface of the display panel 10 in a front and rear direction.

An electrical mounting part 40 may be formed on the rear surface of the module cover 20. In more detail, the electrical mounting part 40 may be formed on the rear surface of the cover body 21. The electrical mounting part 40 may be formed as a separate member from the module cover 20 and fastened to the module cover 20, or the module cover 20 may be molded and formed integrally with the module cover 20.

Electrical components such as a system board (SB) and a power supply (PS) may be mounted on the electrical mounting part 40.

The power supply (PS) may convert commercial AC power into driving power of the system board (SB) and the display panel 10 driving circuit. The system board (SB) may supply DC input power from the power supply (PS) to the display panel 10 driving circuit and transmit an image signal and a timing signal synchronized with the image signal to the display panel 10 driving circuit.

System board (SB) may be a system board for various display applications such as a television system, a set-top box, a navigation system, a DVD player, a Blu-ray player, a personal computer (PC), a home theater system, a phone system, a vehicle control system, or the like.

The system board (SB) may include the PCB 50. The PCB 50 may include a tuner that receives a broadcast signal, an external device interface connected to an external device, a user interface device that receives a user input, various sensors, or the like.

Side brackets 60 may be connected to the side of the PCB 50. The side bracket 60 may be fastened 50 to the electrical mounting part 40 of the module cover 20 together with the PCB.

Meanwhile, the back cover 30 may cover the electrical mounting part 40 and the electrical part such as the PCB 50 mounted on the electrical mounting part 40 from the rear. The back cover 30 may be fastened to the rear surface of the module cover 20.

FIG. 5 is a view illustrating a state where a PCB and a side bracket are separated from a module cover according to an embodiment of the present disclosure, FIG. 6 is a view for explaining a state where the PCB and the side bracket illustrated in FIG. 5 are restricted to the module cover by a restriction member, FIG. 7 is a sectional view illustrating a state where a PCB and a side bracket are restricted to a module cover by a restriction member according to an embodiment of the present disclosure, FIG. 8 is an enlarged view illustrating a fixing recess of a PCB and a PCB connector of a side bracket, and FIG. 9 is a rear view illustrating a PCB and a side bracket according to an embodiment of the present disclosure.

The PCB 50 and the side bracket 60 may be mounted on the rear surface of the module cover 20. In more detail, the PCB 50 and the side bracket 60 may be fastened to the electrical mounting part 40 formed on the rear surface of the module cover 20.

A protrusion 41 which protrudes toward the rear and is in contact with the PCB 50 may be formed on the electric mounting part 40. The protrusion 41 may be in contact with the front surface of the PCB 50 and support the PCB 50 in the front and rear direction.

A fastening hole 42 may be formed in the protrusion 41. The fastening hole 42 may be formed by penetrating the protrusion 41 in the front and rear direction. A female thread may be formed in the inner circumference of the fastening hole 42. The fastening portion 72 of the restriction member 70 to be described later may be inserted into the fastening hole 42 to be fastened.

The PCB 50 may be mounted on the rear surface of the cover module 20. In more detail, the PCB 50 may be mounted on the electrical mounting part 40 formed on the rear surface of the cover module 20. The rear surface 50A of the PCB 50 may face the inner surface of the back cover 30, and the front surface 50B thereof may be in contact with the protrusion 41 formed on the electrical mounting part 40.

The PCB 50 may be provided with a number of terminals and devices. In more detail, a plurality of input/output terminals 54 may be provided on a side edge of the rear surface 50A of the PCB 50.

A connector (not illustrated) such as a cable or an electric wire may be connected to each input/output terminal 54. Each input/output terminal 54 may be inserted into a terminal hole 61A (see FIG. 10) formed on the side bracket 60 or located at a point corresponding to the terminal hole 61A, and the connector may be connected to the input/output terminal 54 through a terminal hole 61A.

The PCB 50 may be in contact with the coating layer 20C of the module cover 20. In more detail, the front surface 50B of the PCB 50 may be in contact with the coating layer 20C of the module cover 20. Since the insulation resistance of the coating layer is relatively high, the PCB 50 may not be grounded or may be poorly grounded even when the PCB 50 is in contact with the coating layer C.

In addition, a fixing recess 51 may be formed on the PCB 50. The fixing recess 51 may be formed on the upper edge and the lower edge of the PCB 50, respectively.

However, the position of the fixing recess 51 is not limited thereto and may be changed as necessary. In addition, it is also possible to form a fixing hole instead of the fixing recess 51.

The fastening portion 72 of the restriction member 70 may be positioned in the fixing recess 51. In other words, the fastening portion 72 of the restriction member 70 may pass through the fixing recess 51 and be fastened to the fastening hole 42.

In addition, a fixing piece 62B to be described later may be inserted into the fixing recess 51. The fastening portion 72 of the restriction member 70 may pass between the inner circumference of the fixing recess 51 and the fixing piece 62B and be fastened to the fastening hole 42 of the protrusion 41.

Meanwhile, the side bracket 60 may be connected to the side of the PCB 50. The side bracket 60 may be restricted to the rear surface of the module cover 20 together with the PCB 50 by the restriction member 70. In more detail, the side bracket 60 may be restricted to the electrical mounting part 40.

The side bracket 60 may be long disposed in the vertical direction. The length of the side brackets 60 in the vertical direction may be equal to or longer than the length of the PCB 50 in the vertical direction.

The side bracket 60 may be made of insulating material. The side bracket 60 may be an injection mold product.

The side bracket 60 may include a bracket body 61 on which a terminal hole 61A (see FIG. 10) is formed, and a PCB connector 62 protruding from the bracket body 61.

The bracket body 61 may have a predetermined width in the front and rear direction. At least one terminal hole 61A may be formed through the bracket body 61 in the left and right direction.

The PCB connector 62 may protrude from the bracket body 61. In more detail, the PCB connector 62 may protrude laterally from the upper and lower ends of the bracket body 61.

The PCB connector 62 may be in contact with the PCB 50 to fix the PCB 50. The PCB connector 62 may be restricted by the restriction member 70.

In more detail, the PCB connector 62 may include a contact portion 62A which is in contact with the PCB 50 and a fixing piece 62B connected to the contact portion 62A.

The contact portion 62A may protrude from the bracket body 61. The contact portion 62A may be in contact with the rear surface 50A of the PCB 50.

An open hole 65 may be formed in the contact portion 62A. The open hole 65 may be passed through the contact portion in the front and rear direction. The head portion 71 of the restriction member 70 may be located in the open hole 65. The shape of the open hole 56 is not limited.

The size of the open hole 65 may be larger than the size of the head portion 71 of the restriction member 70. Accordingly, the head portion 71 is located in the open hole 65 and may be in contact with the PCB 50.

The inner circumference of the open hole 65 may surround at least a portion of the outer circumference of the head portion 71 of the restriction member 70. The outer circumference of the head portion 71 and the inner circumference of the opening hole 65 may be spaced apart from each other.

The fixing piece 62B may be connected to the contact portion 62A. The fixing piece 62B may protrude from the contact portion 62A and then extend toward the radially inward direction of the opening hole 65.

The fixing piece 62B may be inserted and fitted into the fixing recess 51 formed on the PCB 50. Accordingly, the PCB connector 62 of the side bracket 60 may be firmly connected to the PCB 50.

The fastening portion 72 of the restriction member 70 may pass between the inner circumference of the fixing recess 51 and the fixing piece 62B. In other words, the fixing recess 51 may include an inner region through which the fastening portion 72 of the restriction member 70 passes, and an outer region positioned outside the inner region and into which the fixing piece 62B is inserted. When the restriction member 70 is fastened, even if the rotational force of the head portion 71 is transmitted to the fixing piece 62B, the fixing piece 62B may not be separated from the fixing recess 51.

The inner region may communicate with the fastening hole 42 of the module cover 20. The head portion 71 of the restriction member 70 may cover the inner region and at least a portion of the fixing piece 62B.

The fixing piece 62B may be fixed between the head portion 71 of the restriction member 70 and the protrusion 41 of the module cover 20 in the front and rear direction. Accordingly, the side bracket 60 may be restricted in the front and rear direction.

Meanwhile, the restriction member 70 may restrict the PCB 50 and the side bracket 60 to the module cover 20 and ground the PCB 50 to the module cover 20.

The restriction member 70 may be a bolt or screw. The restriction member 70 may be made of a metal material and current may be energized to the restriction member.

The restriction member 70 may include a head portion 71 that is in contact with the PCB 50 and restricts the side bracket 60, and a fastening portion 72 that extends from the head portion 71 and is fastened to the module cover 20.

At least a portion of the head portion 71 may be located in an open hole 65 formed in the PCB connector 62 of the side bracket 60.

The head portion 71 may be in contact with the PCB 50 and the fixing piece 62B. In other words, the head portion 71 may include a first region 71A which is in contact with the PCB 50, and a second region 71B which is in contact with the fixing piece 62B. The area of the first region 71A may be wider than the area of the second region 71B.

The fastening portion 72 may extend forward from the head portion 71. The fastening portion 72 may pass through the fixing recess 51 of the PCB 50 to be fastened to the fastening hole 42 of the module cover 20.

Since the fastening hole 42 of the module cover 20 penetrates to the cover main body 20B, the fastening portion 72 is fastened to the fastening hole 42 so that the fastening portion 72 may be in contact with the cover main body 20B of the module cover 20.

In other words, the head portion 71 of the restriction member 70 may be in contact with the PCB 50 and the fastening portion 72 may be in contact with the cover main body 20B made of a metal material. Accordingly, the PCB 50 can be grounded to the cover main body 20B of the module cover 20 through the restriction member 70, and the cover main body 20B can function as a ground. Accordingly, electromagnetic interference (EMI) due to the PCB 50 may be reduced.

FIG. 10 is a perspective view illustrating a side bracket according to an embodiment of the present disclosure, FIG. 11 is a perspective view illustrating the side bracket illustrated in FIG. 10 viewed from a different direction, FIG. 12 is an enlarged view illustrating a periphery of a latch of the side bracket, and FIG. 13 is an enlarged view illustrating a periphery of a rib of the side bracket.

As described above, the side bracket 60 may include a bracket body 61 on which a terminal hole 61A is formed, and a PCB connector 62 protruding from the bracket body 61.

The side bracket 60 may further include a module cover fastening portion 63 connected to the bracket body 61 and fastened to the module cover 20.

The module cover fastening portion 63 may have a shape bent in the bracket body 61. The module cover fastening portion 63 may have a predetermined width in the left and right direction.

At least one through-hole is formed on the module cover fastening portion 63, and a fastening member (not illustrated) such as a screw passes through the through-hole to be capable of being fastened to the rear surface of the module cover 20, in more detail, to the electrical mounting part 40.

The module cover fastening portion 63 and the PCB connector 62 may be located opposite to each other with respect to the bracket body 61.

Meanwhile, the side bracket 60 may further include at least one of a latch 66 protruding from the bracket body 61 and connected to the PCB 50 and a rib 67 protruding from the bracket body 61 and supporting the PCB 50. Hereinafter, a case where the side bracket 60 includes both the latch 66 and the rib 67 will be described as an example.

The latch 66 and the rib 67 may be located on the opposite side of the module cover fastening portion 63 with respect to the bracket body 61. The latch 66 and the rib 67 may protrude from the bracket body 61 in a direction parallel to the PCB connector 62.

The latch 66 and the rib 67 can temporarily fix the side bracket 60 to the PCB 50. The side bracket 60 may be restricted to the cover module 20 by the restriction member 70 in a state of being temporarily fixed to the PCB 50 by the latch 66 and the rib 67.

The latch 66 may be fixed by being caught in a locking hole 55 formed through the PCB 50 in the front and rear direction. Accordingly, the latch 66 may temporarily fix the side bracket 60 to the PCB 50 in the left and right direction and the vertical direction.

The rib 67 may support the PCB 50 by being in contact with the PCB 50. The rib 67 may guide the PCB 50 at the time of connection of the PCB 50 and the side bracket 60.

The latch 66 and the rib 67 may be located opposite to each other with respect to the PCB 50. The latch 66 may be connected to any one of the front surface 50B and the rear surface 50A of the PCB 50, and the rib 67 may support the other one of the front surface 50B and the rear surface 50A of the PCB 50. For example, the latch 66 may be connected to the rear surface 50A of the PCB 50, and the rib may support the front surface 50B of the PCB 50.

Accordingly, the PCB 50 can be fixed between the latch 66 and the rib 67 in the front and rear direction.

FIG. 14 is a sectional view illustrating a state where a PCB and a side bracket are restricted to a module cover by a restriction member according to another embodiment of the present disclosure.

Hereinafter, contents overlapping with the above-described contents will be omitted, and the differences will be mainly described.

The head portion 71' of the restriction member 70' according to the present embodiment may include a small-diameter portion 71C which is in contact with the PCB 50 and a large-diameter portion 71D which has a diameter larger than the small-diameter portion 71C and restricts the side bracket 60.

The fastening portion 72 may be formed to extend from the small-diameter portion 71C. In more detail, the large-diameter portion 71D may be formed at the rear of the small-diameter portion 71C, and the fastening portion 72 may extend forward from the small-diameter portion 71C.

The small-diameter portion 71C is located in the open hole 65 and can be in contact with the PCB 50, and the large-diameter portion 71D is located outside the open hole 65 and can be in contact with the PCB connector 62'.

The large-diameter portion 71D and the small-diameter portion 71C may be formed to be stepped from each other. However, it is not limited thereto, and, of course, a configuration in which the diameter gradually decreases from the large-diameter portion to the small-diameter portion is also possible.

Accordingly, the PCB connector 62' of the side bracket 60 may be restricted between the large-diameter portion 71D and the PCB 50 in the front and rear direction.

Therefore, the PCB connector 62' according to the present embodiment can be firmly fastened to the PCB 50 without including the fixing piece 62B (see FIG. 9), and the fixing hole 51' instead of the fixing recess in the PCB 50 can be formed. The fastening portion 72 of the restriction member 70' may pass through the fixing hole 51' to be fastened to the fastening hole 42 of the cover module 20.

The above description is merely illustrative of the technical idea of the present disclosure, and a person skill in the art to which the present disclosure pertains will be able to make various modifications and variations without departing from the essential characteristics of the present disclosure.

Accordingly, the embodiments disclosed in the present disclosure are not intended to limit the technical idea of the present disclosure, but to explain the technical idea, and the scope of the technical idea of the present disclosure is not limited by these embodiments.

The scope of protection of the present disclosure should be interpreted by the following claims, and all technical ideas within the scope equivalent thereto should be construed as being included in the scope of the present disclosure.

EXPLANATION OF REFERENCE NUMERAL

| | |
|---|---|
| 10: display panel | 120: module cover |
| 20B: cover main body | 20C: coating layer |
| 40: electrical mounting part | 42: fastening hole |
| 50: PCB | 51: fixing recess |
| 60: side bracket | 61: bracket body |
| 62: PCB connector | 62A: contact portion |
| 62B: fixing piece | 65: open hole |
| 66: latch | 67: rib |
| 70: restriction member | 71: head portion |
| 72: fastening portion | |

The invention claimed is:

1. A display device comprising:
a display panel;
a module cover disposed behind the display panel;
a printed circuit board (PCB) mounted on a rear surface of the module cover;
a side bracket connected to a side of the PCB and restricted by the rear surface of the module cover; and
a restriction member restricting the PCB and the side bracket to the module cover and grounding the PCB to the module cover,
wherein the restriction member includes
a head portion which is in contact with the PCB and restricts the side bracket; and
a fastening portion extending from the head portion and fastened to the module cover, and
wherein the module cover includes
a cover main body which is made of metal and in contact with the fastening portion; and
a coating layer which is coated on a surface of the cover main body, has an insulation resistance higher than that of the cover main body, and is in contact with the PCB.

2. The display device of claim 1,
wherein the side bracket includes
a bracket body having a terminal hole corresponding to a terminal provided in the PCB; and
a PCB connector protruding from the bracket body and restricted by the head portion.

3. The display device of claim 2,
wherein a fixing recess in which a portion of the fastening portion is located is formed in the PCB.

4. The display device of claim 3,
wherein the PCB connector includes
a contact portion which has an open hole larger than the head portion and is in contact with the PCB; and
a fixing piece which is connected to the contact portion and inserted into the fixing recess.

5. The display device of claim 4,
wherein the head portion includes
a first region which is in contact with the PCB; and
a second region which is in contact with the fixing piece.

6. The display device of claim 5,
wherein an area of the first region is wider than an area of the second region.

7. The display device of claim 4,
wherein at least a portion of an outer circumference of the head portion is surrounded by an inner circumference of the open hole.

8. The display device of claim 2,
wherein the side bracket further includes at least one of
a latch protruding from the bracket body and connected to the PCB; or
a rib protruding from the bracket body and supporting the PCB.

9. The display device of claim 2,
wherein the side bracket includes
a latch protruding from the bracket body and connected to one of a front surface or a rear surface of the PCB; and a rib protruding from the bracket body and supporting the other of the front surface or the rear surface of the PCB.

10. The display device of claim 1, wherein the module cover is made of a pre-coated metal (PCM) material.

11. The display device of claim 1, wherein the head portion includes
   a small-diameter portion which is in contact with the PCB; and
   a large-diameter portion having a larger diameter than the small-diameter portion and restricting the side bracket.

* * * * *